(12) United States Patent
Chen et al.

(10) Patent No.: US 7,252,099 B2
(45) Date of Patent: Aug. 7, 2007

(54) WAFER CLEANING APPARATUS WITH MULTIPLE WASH-HEADS

(75) Inventors: Chih-Kun Chen, Pa Te (TW); Yao-Hsiung Kung, Tao Yuan Hsien (TW)

(73) Assignee: Nan Ya Technology Corporation, Tao Yuan Hsien (TW)

( * ) Notice: Subject to any disclaimer, the term of this patent is extended or adjusted under 35 U.S.C. 154(b) by 704 days.

(21) Appl. No.: 10/655,224

(22) Filed: Sep. 5, 2003

(65) Prior Publication Data

US 2005/0051200 A1 Mar. 10, 2005

(51) Int. Cl.
*B08B 3/00* (2006.01)

(52) U.S. Cl. .......... 134/103.2; 134/181; 134/94.1; 134/148; 134/153; 134/198; 134/902; 15/77; 15/102; 15/88.2

(58) Field of Classification Search ............ 15/77, 15/88.2, 102; 134/103.2, 148, 181, 153, 134/94.1, 198

See application file for complete search history.

(56) References Cited

U.S. PATENT DOCUMENTS

| | | | |
|---|---|---|---|
| 2,480,489 A * | 8/1949 | Marcus et al. | 15/88.2 |
| 5,345,640 A * | 9/1994 | Goss | 15/88.2 |
| 5,636,401 A * | 6/1997 | Yonemizu et al. | 15/77 |
| 5,804,507 A * | 9/1998 | Perlov et al. | 438/692 |
| 6,286,525 B1 * | 9/2001 | Nishimura et al. | 134/95.3 |
| 6,330,728 B2 * | 12/2001 | Ueki et al. | 15/77 |
| 6,381,796 B1 * | 5/2002 | Sato | 15/77 |
| 6,418,584 B1 * | 7/2002 | Teeny et al. | 15/102 |
| 6,423,149 B1 * | 7/2002 | Crevasse et al. | 134/6 |
| RE38,228 E * | 8/2003 | Hirose et al. | 451/56 |
| 2003/0000550 A1 * | 1/2003 | Middendorf et al. | 134/6 |
| 2003/0115698 A1 * | 6/2003 | Yeo | 15/77 |

FOREIGN PATENT DOCUMENTS

| | | | |
|---|---|---|---|
| JP | 56015974 A | * | 2/1981 |
| JP | 2000013008 A | * | 1/2000 |
| WO | WO 8203040 A | * | 9/1982 |

* cited by examiner

*Primary Examiner*—Michael Barr
*Assistant Examiner*—Sarah E. Husband
(74) *Attorney, Agent, or Firm*—Birch, Stewart, Kolasch & Birch, LLP (57) ABSTRACT

A wafer cleaning apparatus with multiple wash-heads is applied in chemical and mechanical polishing process after wafer cleaning. The wafer cleaning apparatus device includes a supporting base, which supporting base comprises a driving device and at least one fluid pipe. A rotation module is also included in the wafer cleaning apparatus. The top side of the rotation module is connected with the driving device. Besides, the rotation module comprises multiple wash-heads and at least one nozzle. The bottom side of wash-head here is contacted with the surface of the wafer. By using driving device, the rotation module can be wholly driven. Also, multiple wash-heads can rotate individually along a cleaning path for cleaning wafer. The fluid was jetted from nozzle and assistant to clean wafer through fluid pipe. The prior art of single wafer wash-head is easily to reform a cleaning dead angle in wafer cleaning process.

16 Claims, 7 Drawing Sheets

140
WAFER CLEANING APPARATUS WITH MULTIPLE WASH-HEADS

BACKGROUND OF THE INVENTION

1. Field of the Invention

The present invention relates to a wafer cleaning apparatus with multiple wash-heads. More particularly, it is a wafer cleaning apparatus using a specialized cleaning path to clean wafers.

2. Description of the Related Art

Figure 1:
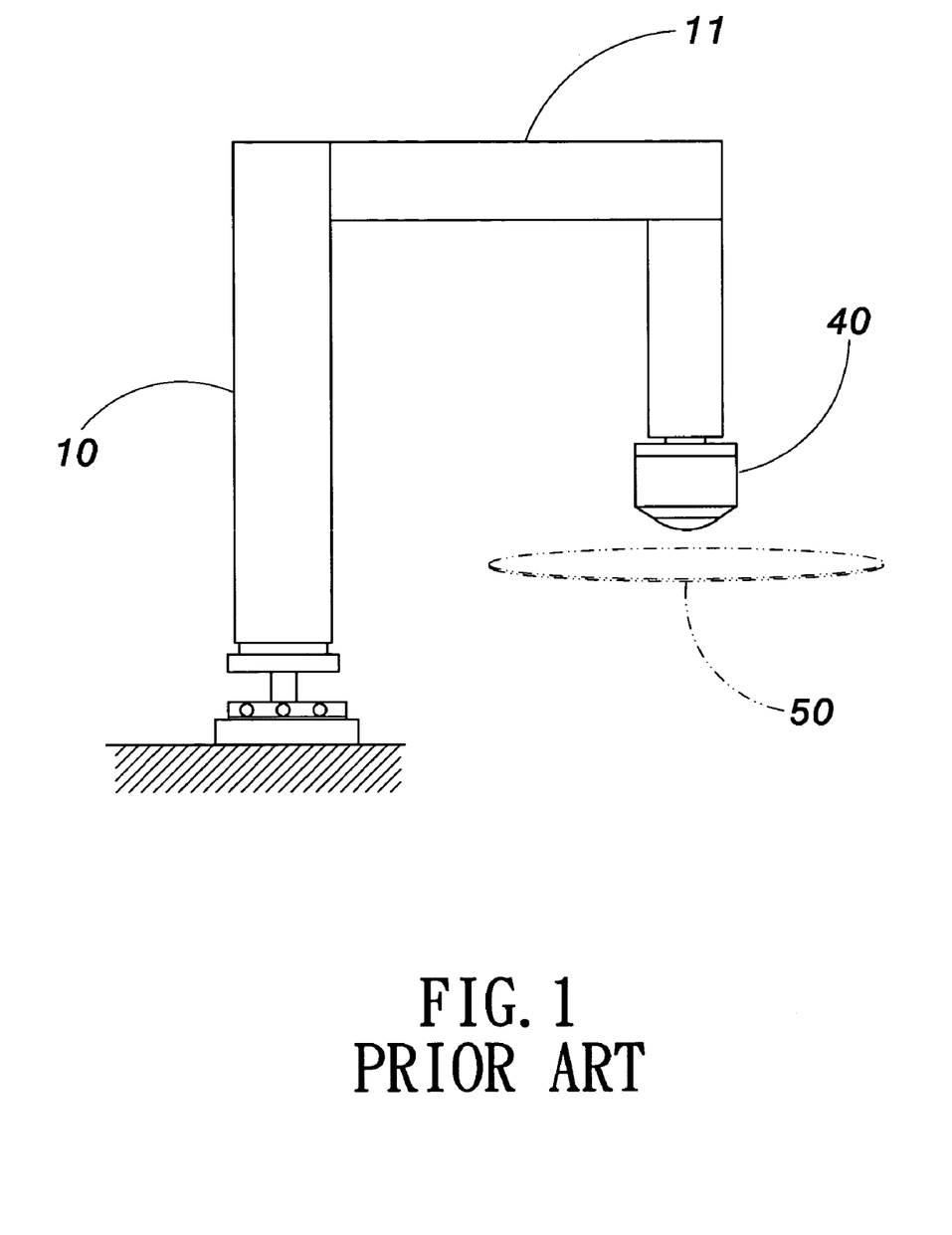
FIG. 1 is a side view of the single wash-head wafer cleaning apparatus for the prior art.
Figure 2A:
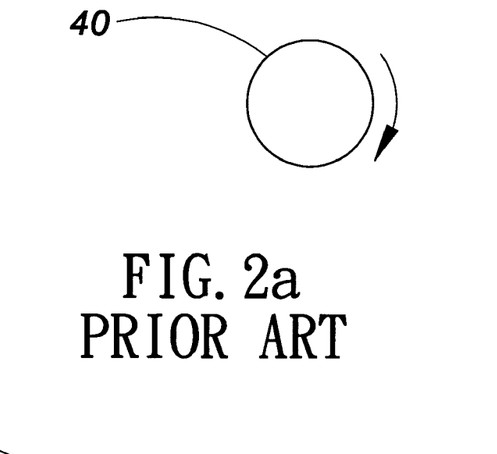
FIG. 2a illustrated a traditional wafer cleaning apparatus showing wash-head cleaning motion.
Figure 2B:
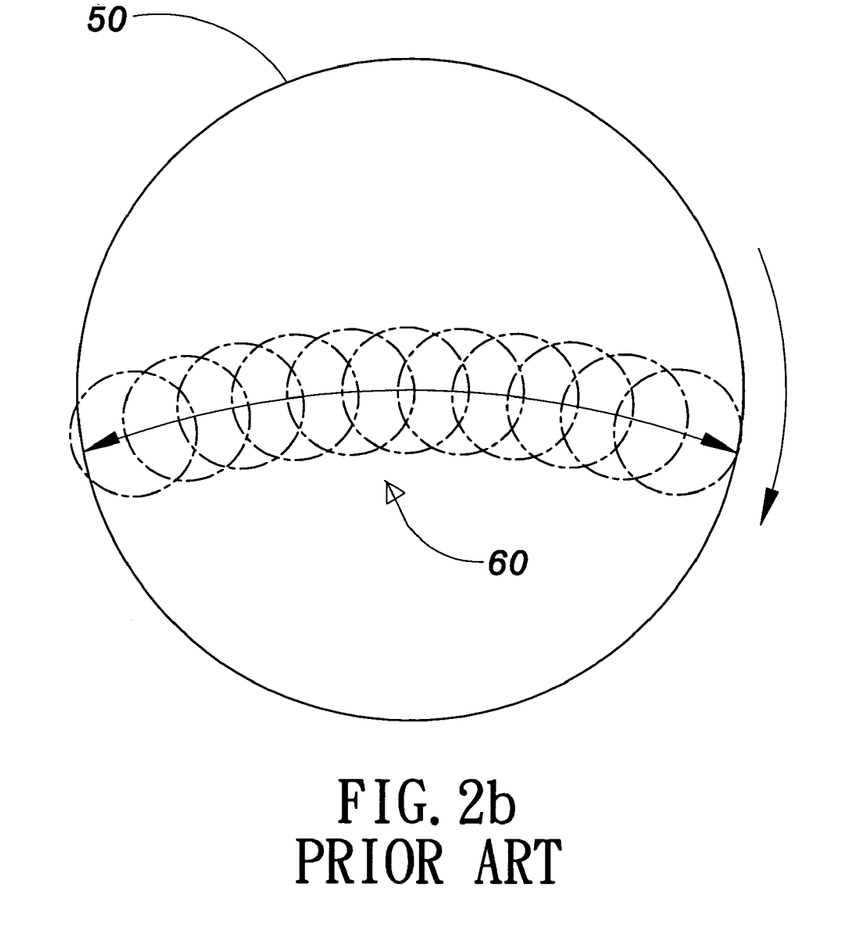
FIG. 2b illustrated a traditional wafer cleaning apparatus showing cleaning paths.

The wafer cleaning apparatus only comprises with a wafer wash-head, and uses a single wash-head to process wafer cleaning motion. Please referring to FIG. 1, it is a single wash-head wafer cleaning apparatus. It comprises with a supporting base 10, which inside of supporting base having a driving device not presented in the figure, and a single wash-head. FIG. 2a is a schematic diagram of the prior art showing cleaning motion of a single wash-head wafer cleaning apparatus. The cleaning motion for washing wafer as shown in the graph includes the motion of self-rotation and oscillation by wash-head 40. Please referring to FIG. 2, it is a schematic diagram of the prior art showing cleaning path of a single wash-head wafer cleaning apparatus. The wafer 50 will rotate by a wafer loading device not presented in the figure along a cleaning path to clean wafers. However, the relative motion is zero while cleaning path 60 is between a wash-head 40 and a wafer 50, and the place here for cleaning is in worse condition. Particles increase gradually according to this.

According to the above description, the present invention is to provide to a wafer cleaning apparatus with multiple wash-heads. By using the wafer cleaning apparatus, it can overcome the problems of particles existing on the surface, and those problems are caused by zero of relative motion between the wash-head and the wafer.

SUMMARY OF THE INVENTION

According to above description, the purpose of present invention is to provide a wafer cleaning apparatus with multiple wash-heads. By changing the numbers of wash-heads in the wafer cleaning process, the process after chemical and mechanical polishing can remove particles from the surface of the wafer, and achieve the optimal cleaning purpose.

Using multiple wash-heads to perform self-rotation along an effective cleaning path during wafer cleaning process is another purpose in present invention. This can avoid dead angle reformed by zero of relative motion between pre-washed wafer and wash-head as shown in prior art.

In addition, a nozzle designed in a multiple wash-heads wafer cleaning apparatus is another purpose in the present invention. The nozzle of cleaning apparatus can jet high-pressure fluid to assistantly clean wafers while processing wafer cleaning.

Other objects, features, and advantages of the present invention will become more fully apparent from the following detailed description of the preferred embodiments, the appended claims, and the accompanying drawings.

It is to be understood that both the foregoing general description and the following detailed description are exemplary, and are intended to provide further explanation of the invention as claimed.

BRIEF DESCRIPTION OF THE DRAWINGS

The accompanying drawing is included to provide a further understanding of the invention, and is incorporated in and constitutes a part of this specification. The drawing illustrates an embodiment of the invention and, together with the description, serves to explain the principles of the invention. In the drawing.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers are used in the drawings and the description to refer to the same or like parts.

The present invention is to provide a wafer cleaning apparatus with multiple wash-heads and it will be described in details as followings. According to its broadest aspect, it should be noted that the objects and advantages of the present invention may be attained by means of any compatible combinations.

The present invention relates to a wafer cleaning apparatus with multiple wash-heads. This apparatus is applied in chemical and mechanical polishing process after wafer cleaning. The wafer cleaning apparatus device includes a supporting base, which supporting base is comprised of a driving device and multiple fluid pipes. A rotation module is also included in the wafer cleaning apparatus. The top side of the rotation module is connected with the driving device. Besides, the rotation module is comprised of multiple wash-heads and at least one nozzle. The bottom side of wash-head here is contacted with the surface of the wafer. By using driving device, the rotation module can be wholly driven. Also, multiple wash-heads can rotate individually along a cleaning path for cleaning wafer. The fluid was jetted from nozzle assistantly to clean wafer through fluid pipes.

Figure 3A:
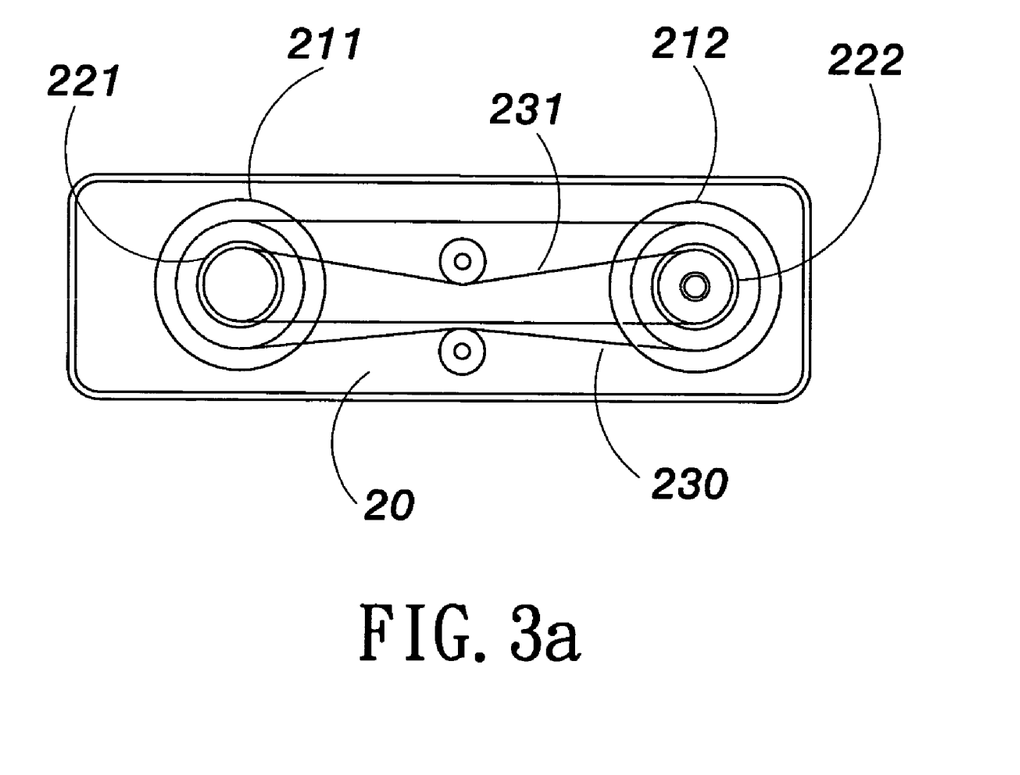
FIG. 3a is the top view of a preferred embodiment showing a multiple wash-heads wafer cleaning apparatus in present invention.
Figure 3B:
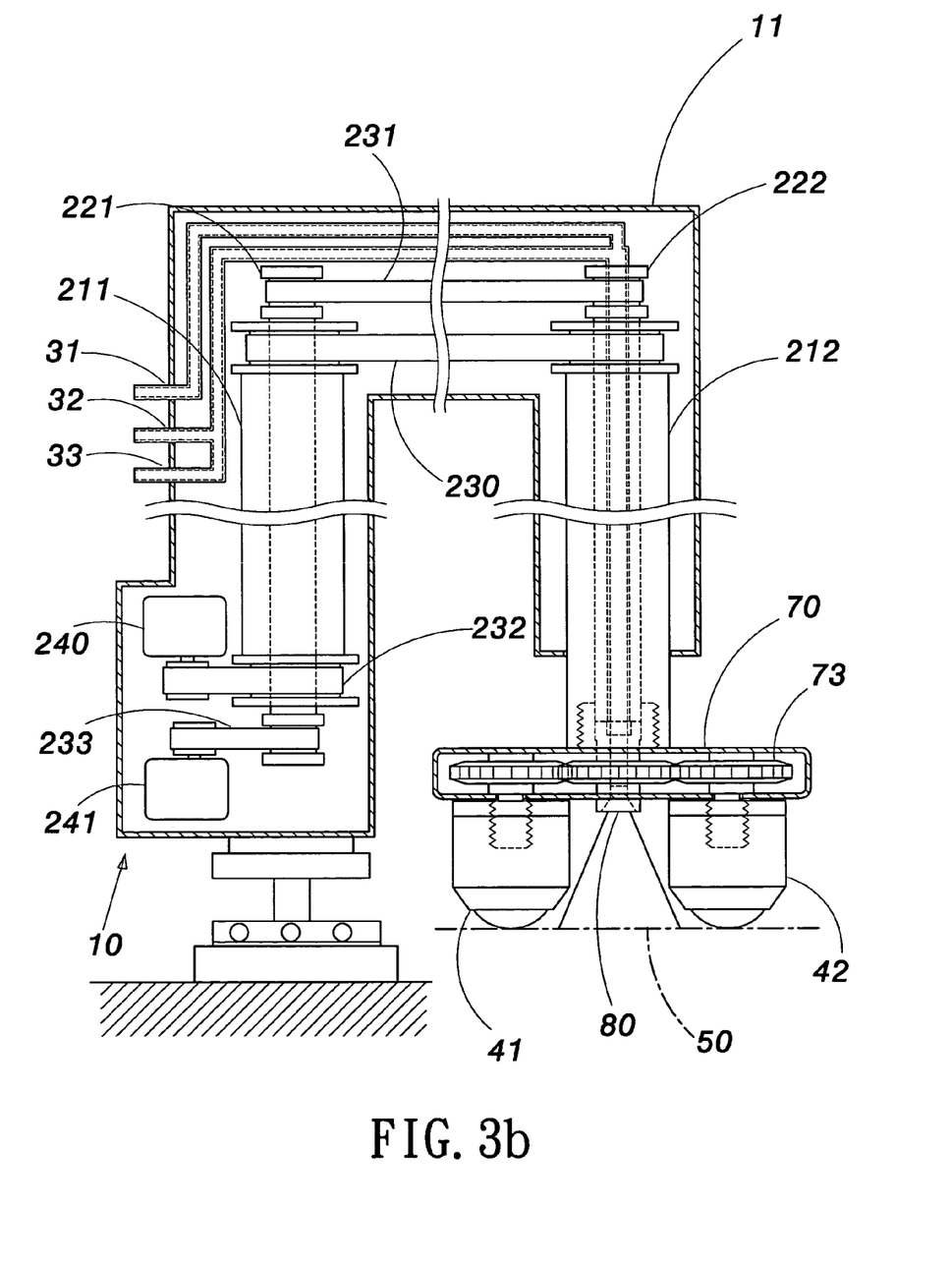
FIG. 3b is the side view of another preferred embodiment showing a multiple wash-heads wafer cleaning apparatus in present invention.

Referring to FIG. 3a and FIG. 3b, there are top view and side view of the preferred embodiments in the present invention showing a wafer cleaning apparatus with multiple wash-heads. This apparatus is applied in chemical and mechanical polishing process after wafer cleaning. The wafer cleaning apparatus comprises with a supporting base 10, and the extended arm 11 is on the supporting base 10. A driving device is also included by a couple of the first rotation axes 211 and 212 and the second rotation axes 221 and 222, the first motor 240, the second motor 241, three fluid pipes 31, 32, 33 and at least four transmission belts 230, 231, 232, 233. The second couple of rotation axes 221 and 222 here pass through the first couple of rotation axes 211 and 212. One of the first couple rotation axes 211 passes through one of the second couple rotation axes 222, which is located inside of the supporting base 10. However, the other of the first couple rotation axes 212 and the other of the second couple rotation axes 222 are located inside of the extended arm 11. One 230 of the first transmission belts was mounted on the top side of the first couple rotation axes 211 and 212, and one 231 of the second transmission belts was mounted on the top side of the second couple rotation axes 221 and 222. Besides, one of the third transmission belts 232 is mounted on the bottom side of the first rotation axis 211 and one of the fourth transmission belts 233 is mounted on the second rotation axis 221. The other side of the third transmission belt 232 is connected with the first motor 240, and the other side of the fourth transmission belt 233 is connected with the second motor 241. A rotation module 70 is also included in present apparatus. The top side of the rotation module 70 is connected with a driving device 20. The rotation module at least comprises with a nozzle 80, a gear set 73, and two wash-heads 41 and 42. The bottom sides of the two wash-heads 41, and 42 are contacted with the wafer 50. By using driving device, the rotation module can be wholly driven. Also, multiple wash-heads can rotate individually along a cleaning path for cleaning wafer. The fluid was jetted from nozzle and assistant to clean wafer through fluid pipe.

The above description presents the wafer cleaning apparatus process further. The wafer cleaning process uses the first motor 240 to drive the third transmission belt 232 and further to drive the first rotation axis 211. Then, it drives the first transmission belt 230 and makes the rotation module 70 is wholly driven from driven rotation axis 212. Similarly, the motor 241 drives the fourth transmission belt 233 and further drives the second rotation axis 221 and the second transmission belt 231. This makes the second driven rotation axis 222 drives the gear set 73 of the rotation module 70. Finally, gear set 73 can control the wash-heads 41 and 42 and make them self-rotate to clean wafers 50. While in the cleaning process, nitrogen, deionized water, and chemical liquid can lead into the fluid pipes 31, 32, and 33 of the supporting base 10. Then, passing through a nozzle 80 to have a high-pressure water jet to assistantly clean the wafers 50.

Figure 4:
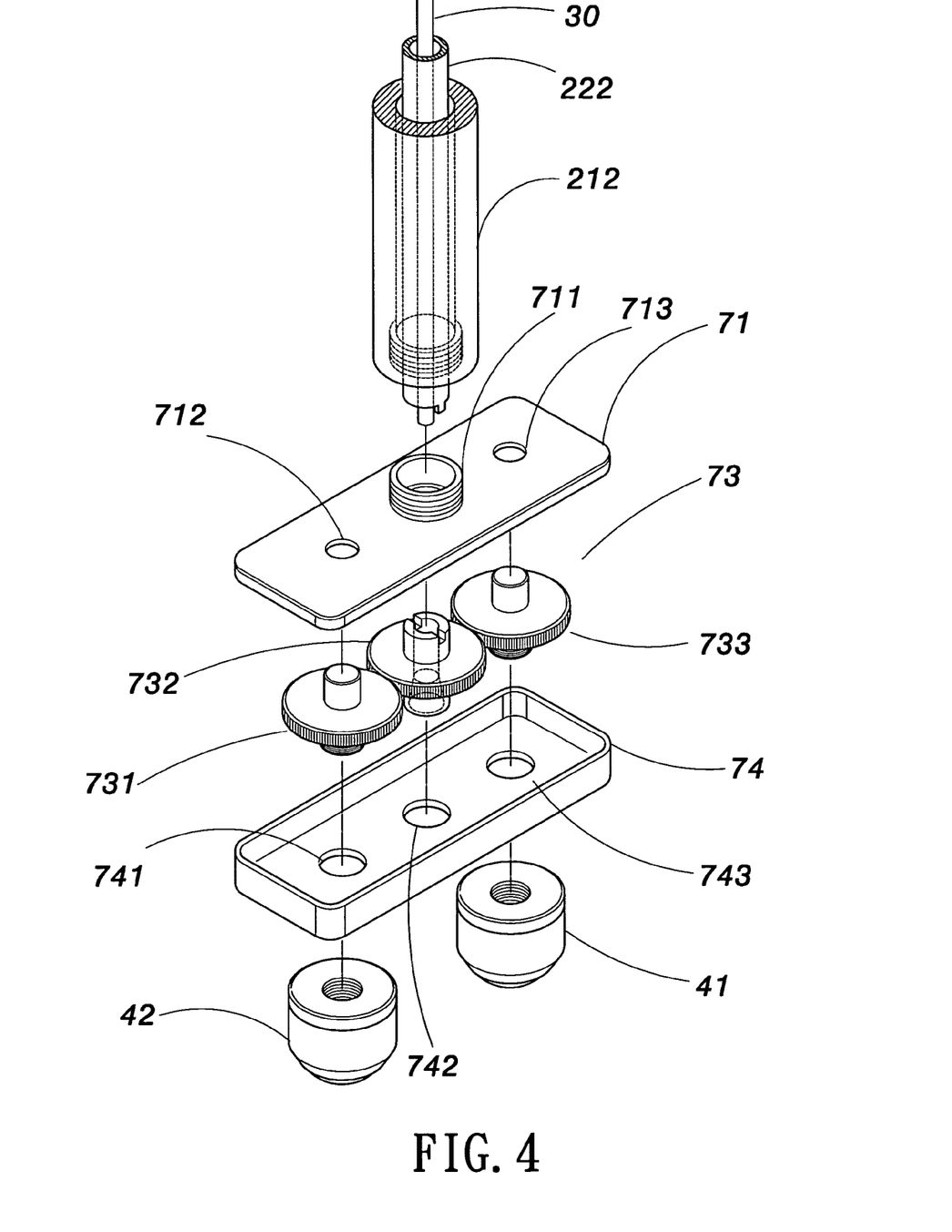
FIG. 4 illustrated a rotation module of a double wash-heads wafer cleaning apparatus in present invention.

FIG. 4 illustrates the preferred embodiment of a double wash-heads cleaning apparatus showing rotation module in the present invention. The rotation module 70 comprises with a top fixed plate 71, a gear set 73, and a bottom fixed plate 74 and two wash-heads 41 and 42. The gear set 73 is between the top fixed plate 71 and the bottom fixed plate 74. The top axes of the gear 731 and 733 in the gear set 73 extended to the top of the fixed holes 712 and 713 in the top fixed plate. The bottom axes extended to the bottom of the fixed holes 741 and 743 in the bottom fixed plate. Besides, the bottom end of the gear 732 in the gear set 73 extended to the bottom of the fixed hole 742 in the bottom fixed plate. The top of the rotation module 70 here is connected with the first rotation axis 212, the second rotation axis 222 and a fluid pipe 30. The top of the fixed plate 71 comprises with a lock-up device 711 and can lock with the first rotation axis 212 and fix the fluid pipe 30 at the same time. The gear set 73 passes through the first rotation axis 212 and the second rotation axis by using the lock-up device 711. The second rotation axis 222 can drive gear set 73 and make each wash-head self-rotate. Furthermore, the fluid pipe 30 will not bend and causes fluid jet by lock-up device while rotation module is in the rotation process. The fluid pipe 30 also can flow into different fluid pipes.

Figure 5A:
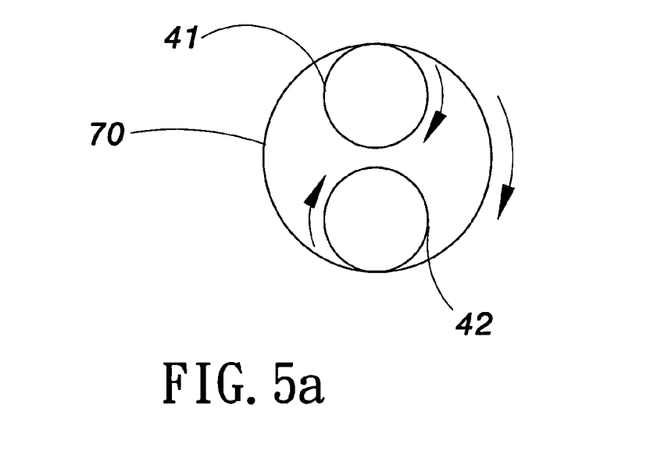
FIG. 5a illustrated a wash-head and a rotation module of a double wash-heads wafer cleaning apparatus in present invention.
Figure 5B:
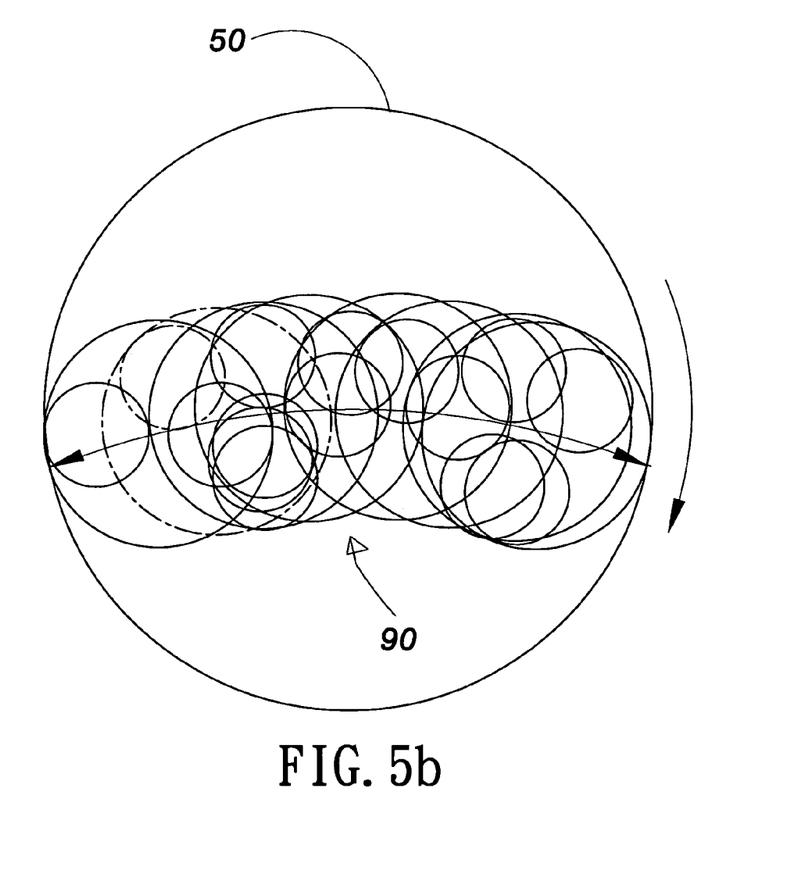
FIG. 5b illustrated a cleaning path of a double wash-heads wafer cleaning apparatus in present invention.

FIG. 5a illustrated a wash-head and a rotation module of a double wash-heads wafer cleaning apparatus in present invention. The rotation module 70 of the double wash-heads wafer cleaning apparatus uses the first motor 240 to drive one of the third transmission belts 232, and then drive the first rotation axis 211. After that, it drives the first transmission belt 232 and the first rotation axis 212 is also driven to make the rotation module 70 wholly be driven. Similarly, the second motor 241 drives the fourth transmission belt 233 and further drives the second rotation axis 221 and the second transmission belt 231. This makes the second driven rotation axis 222 drives the gear set 73 of the rotation module 70. Finally, gear set 73 can control the wash-heads 41 and 42 and make them self-rotate to clean wafers 50. FIG. 5b illustrated a cleaning path of a double wash-heads wafer cleaning apparatus in present invention. The wash-head and rotation module reform a complicated path 90 in the cleaning wafer 50. The cleaning path 90 will not become zero in relative speed caused of wafer rotation. Therefore, it can enhance the wafer cleaning ability.

Figure 6:
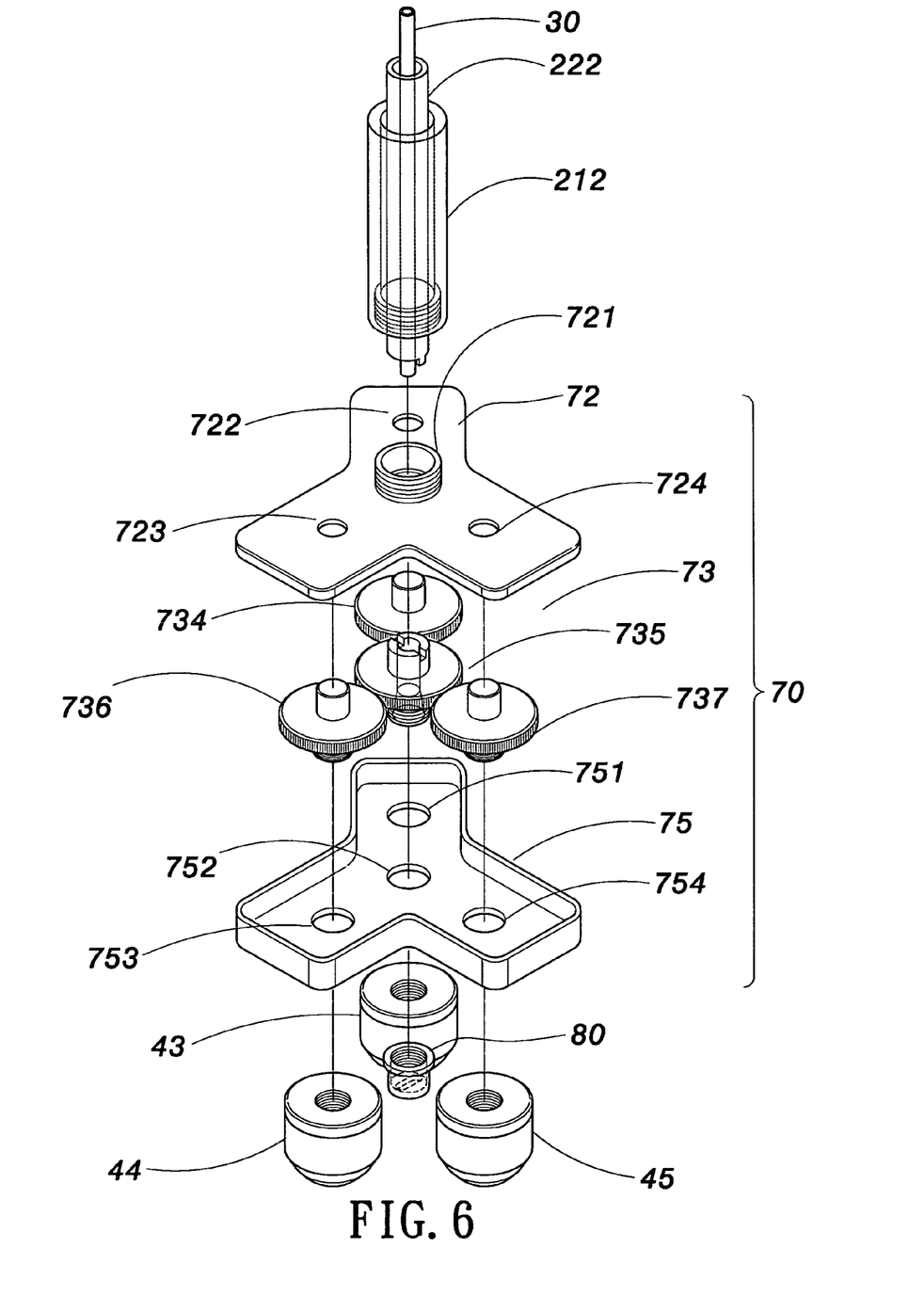
FIG. 6 illustrated a rotation module of a triple wash-heads wafer cleaning apparatus in present invention.

Referring to FIG. 6, FIG. 6 illustrates the preferred embodiment of a triple wash-heads cleaning apparatus showing rotation module in the present invention. The rotation module 70 comprises with a top fixed plate 72, a gear set 73, and a bottom fixed plate 75 and three wash-heads 43, 44, and 45. The gear set 73 is between the top fixed plate 72 and the bottom fixed plate 75. The top axes of the gears 734, 736, and 737 in the gear set 73 fix in the three top fixed holes 722, 723, 724 in the top fixed plate 75. The bottom axes fix in the bottom fixed holes 751, 753 and 754 of the bottom plate 75. A gear 735 is disposed among of the gears 734, 736 and 737. The top fix plate 72 and the bottom fix plate 75 have a top fix hole 721 and a bottom fix hole 752 respectively. The top axis of the gear 735 and the bottom axis thereof are fixed in the top fix hole 721 and the bottom fix hole 752 respectively. The top side of the rotation module 70 is connected with the first rotation axis 212, the second rotation axis 222 and the fluid pipe 30. Moreover, the top of the fixed plate 72 comprises with a lock-up device 721 and can lock with the first rotation axis 212, and fix the fluid pipe 30 at the same time. The gear set 73 was passed through the first rotation axis 212 and the second rotation axis 222 by using the lock-up device 721. The second rotation axis 222 can drive gear set 73 and make each wash-head self-rotate. Furthermore, the fluid pipe 30 will not bend and causes fluid jet by lock-up device while rotation module is in the rotation process. The fluid pipe 30 also can flow into different fluid pipes.

What is claimed is:

1. A wafer cleaning apparatus with multiple wash-heads adapted for a wafer cleaning process, comprising:
a supporting base including a driving device wherein the driving device comprises a couple of first rotation axes, a couple of second rotation axes, a first transmission belt, a second transmission belt, a third transmission belt, a fourth transmission belt, a first motor driving one of the rotation axes which is conveyed by the third transmission belt, thereby to drive the first transmission belt and further enable the first rotation axis to rotate the rotation module and a second motor driving the fourth transmission belt and further driving one of the second rotation axes thereby to drive the second transmission belt and enable the second rotation axis to rotate the rotation module for controlling the wash-heads to self-rotate and clean wafers; and a rotation module having a top side connected with the driving device, and the rotation module having multiple wash-heads;

wherein the bottom side of the wash-head is connected with a wafer, and by using the driving device, the rotation module is wholly driven and the wash-heads self-rotate along a cleaning path for cleaning wafers.

2. The apparatus according to claim 1, wherein the first transmission belt is mounted on the top side of the first rotation axis, and the second transmission belt is mounted on the top side of the second rotation axis, and the third transmission belt is mounted on the bottom side of the first rotation axis, and the fourth transmission belt is mounted on a bottom side of the second rotation axis, and the other side of the third transmission belt is corrected with the first motor, and the other side of the fourth transmission belt is connected with the second motor.

3. The apparatus according to claim 1, wherein the rotation module includes a gear set for assisting the driving device to drive the wash-heads self-rotate.

4. The apparatus according to claim 1, wherein the second motor drives one of the second rotation axes which is conveyed by the fourth transmission belt, and thereby to drive the second transmission belt and enable the second driven axis to rotate the gear set of the second rotation module, and using the gear set to control the wash-heads for cleaning wafer by self-rotation.

5. The apparatus according to claim 1, wherein the rotation module has at least one nozzle, and the nozzle jets high-pressure water in the wafer cleaning process.

6. The apparatus according to claim 5, wherein the supporting base has at least one fluid pipe, and nitrogen passes through the fluid pipe and is jetted out from the nozzle of the rotation module.

7. The apparatus according to claim 5, wherein the supporting base has at least one fluid pipe, and deionized water passes through the fluid pipe and is jetted out from the nozzle of the rotation module.

8. The apparatus according to claim 5, wherein the supporting base has at least one fluid pipe, and the chemical liquid passes through the fluid pipe and is jetted out from the nozzle of the rotation module.

9. A wafer cleaning apparatus with multiple wash-heads adapted for a wafer cleaning process, comprising:

a supporting base including a driving device passed therethrough, and the driving device including a couple of first rotation axes, a couple of second rotation axes, a first motor, a second motor, wherein the second rotation axes pass through the first rotation axes individually, and the first transmission belt is mounted on the top side of the first rotation axis, and the second transmission belt is mounted on the top side of the second rotation axis, and the third transmission belt is mounted on the bottom side of the first rotation axis, and the fourth transmission belt is mounted on the bottom side of the second rotation axis, and the other side of the third transmission belt is connected with the first motor, and the other side of the fourth transmission belt is connected with the second motor; and a rotation module having a top side connected with one end of the first rotation axis, and has multiple wash-heads;

wherein the bottom sides of the multiple wash-heads are connected with the wafer and the second motor drives the first and the third transmission belts, the first rotation axis makes the rotation module wholly driven, and moreover, when the second motor drives the second and the fourth transmission belts, the second rotation axis makes the rotation module self-rotates allowing the multiple wash-heads to self-rotate for cleaning wafers.

10. The apparatus according to claim 9, wherein the rotation module comprises a gear set, a top fixed plate, a bottom fixed plate and a plurality of lock-up devices, and the gear set is arranged between the top and the bottom fixed plates, and by using the lock-up device and one of the first rotation axis, one of the lock-up device drives the rotation module wholly rotated.

11. The apparatus according to claim 10, wherein said one of the first rotation axes passes through the second rotation axis by using lock-up device, the second rotation axis makes the gear set be driven, therefore, each wash-head rotate by itself.

12. The apparatus according to claim 9, wherein the rotation module has at least one nozzle, and the nozzle jets high-pressure water in the wafer cleaning process.

13. The apparatus according to claim 9, wherein the supporting base comprises with a fluid pipe, and nitrogen passes through the fluid pipe and is jetted out from the nozzle of the rotation module.

14. The apparatus according to claim 9, wherein the supporting base has at least one fluid pipe, and the deionized water passes through the fluid pipe and is jetted out from the nozzle of the rotation module.

15. The apparatus according to claim 9, wherein the supporting base has at least one fluid pipe, and the chemical liquid passes through the fluid pipe and is jetted out from the nozzle of the rotation module.

16. The apparatus according to claim 10, wherein said top fixed plate and bottom fixed plate are made of Aluminum material.

* * * * *